US008823093B2

(12) United States Patent
Banerjee et al.

(10) Patent No.: US 8,823,093 B2
(45) Date of Patent: *Sep. 2, 2014

(54) HIGH-VOLTAGE TRANSISTOR STRUCTURE WITH REDUCED GATE CAPACITANCE

(75) Inventors: Sujit Banerjee, San Jose, CA (US); Vijay Parthasarathy, Mountain View, CA (US)

(73) Assignee: Power Integrations, Inc., San Jose, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 13/532,583

(22) Filed: Jun. 25, 2012

(65) Prior Publication Data
US 2012/0273885 A1 Nov. 1, 2012

Related U.S. Application Data

(63) Continuation of application No. 12/586,890, filed on Sep. 29, 2009, now Pat. No. 8,207,577.

(51) Int. Cl.
*H01L 29/76* (2006.01)

(52) U.S. Cl.
USPC .......................................... 257/335; 257/408

(58) Field of Classification Search
USPC ................................................ 257/335, 408
See application file for complete search history.

(56) References Cited

U.S. PATENT DOCUMENTS

| 2,451,632 A | 10/1948 | Oliver |
| 2,770,531 A | 11/1956 | Hawes et al. |
| 2,833,963 A | 5/1958 | Tognola |
| 4,769,685 A | 9/1988 | MacIver et al. |
| 5,999,429 A | 12/1999 | Brown |
| 6,049,178 A | 4/2000 | Sheu et al. |
| 6,424,125 B1 | 7/2002 | Graham |
| 6,683,344 B2 | 1/2004 | Tsukanov et al. |
| 6,813,170 B2 | 11/2004 | Yang |
| 8,115,457 B2 | 2/2012 | Balakrishnan et al. |
| 8,207,577 B2 | 6/2012 | Banerjee et al. |
| 8,461,915 B2 | 6/2013 | Huang et al. |
| 2004/0090736 A1 | 5/2004 | Bendale et al. |
| 2005/0248968 A1 | 11/2005 | Chang |
| 2007/0194759 A1 | 8/2007 | Shimizu et al. |
| 2008/0067946 A1 | 3/2008 | Simonsen et al. |
| 2009/0009145 A1 | 1/2009 | Odajima et al. |
| 2009/0033294 A1 | 2/2009 | Odajima et al. |
| 2009/0082882 A1 | 3/2009 | Parfitt |
| 2009/0153123 A1 | 6/2009 | Kraft |

(Continued)

FOREIGN PATENT DOCUMENTS

| CN | 101345475 | 1/2009 |
| EP | 0325136 | 7/1989 |

*Primary Examiner* — Samuel Gebremariam
(74) *Attorney, Agent, or Firm* — The Law Offices of Bradley J. Bereznak

(57) ABSTRACT

In one embodiment, a high voltage field-effect transistor (HVFET) includes a field oxide layer that covers a first well region, the field oxide layer having a first thickness and extending in a second lateral direction from a drain region to near a second well region. A gate oxide covers a channel region and has a second dimension in a first lateral direction. A gate extends in the second lateral direction from the source region to over a portion of the field oxide layer, the gate being insulated from the channel region by the gate oxide, the gate extending in the first lateral dimension over an inactive area of the HVFET beyond the second dimension of the gate oxide, the gate being insulated from the first and second well regions over the inactive area by the field oxide layer.

10 Claims, 3 Drawing Sheets

(56) References Cited

U.S. PATENT DOCUMENTS

| | | |
|---|---|---|
| 2009/0174386 A1 | 7/2009 | Popescu et al. |
| 2009/0261787 A1 | 10/2009 | Cegnar et al. |
| 2009/0315401 A1 | 12/2009 | Yoshida et al. |
| 2009/0315518 A1 | 12/2009 | Soma et al. |
| 2009/0315521 A1 | 12/2009 | Watanabe |
| 2011/0073942 A1 | 3/2011 | Banerjee et al. |
| 2011/0175579 A1 | 7/2011 | Mazumdar |
| 2012/0273885 A1 | 11/2012 | Banerjee et al. |

HIGH-VOLTAGE TRANSISTOR STRUCTURE WITH REDUCED GATE CAPACITANCE

This application is a continuation of application Ser. No. 12/586,890, filed Sep. 29, 2009, entitled, "HIGH-VOLTAGE TRANSISTOR STRUCTURE WITH REDUCE GATE CAPACITANCE", now U.S. Pat. No. 8,207,577, which is assigned to the assignee of the present application.

RELATED APPLICATIONS

The present application is related to application Ser. No. 12/533,977 (the "'977" patent application) filed Jul. 31, 2009, now U.S. Pat. No. 8,115,457, entitled, "Method and Apparatus for Implementing a Power Converter Input Terminal Voltage Discharge Circuit", which is assigned to the assignee of the present application, and which application is herein incorporated by reference.

TECHNICAL FIELD

The present disclosure relates to semiconductor device structures and processes for fabricating high-voltage transistors. More specifically, the present disclosure relates to transistor device structures useful in discharging a capacitor coupled across the input of a power system.

BACKGROUND

High-voltage, field-effect transistors (HVFETs) are well known in the semiconductor arts. Many HVFETs employ a device structure that includes an extended drain region that supports or blocks the applied high-voltage (e.g., several hundred volts) when the device is in the "off" state. A conventional HVFET structure has a source region and a drain region separated by an intermediate channel region. A gate structure is disposed over a thin gate oxide layer over the metal-oxide-semiconductor (MOS) channel of the device. In the "on" state, a voltage is applied to the gate to cause a conduction channel to form between the source and drain regions, thereby allowing current to flow through the device. In the off state, the voltage on the gate is sufficiently low such that no conduction channel is formed in the substrate, and thus no current flow occurs. In the off state, high voltage is supported between the drain and source regions.

Power integrated circuits that include HVFET structures are commonly utilized for a multitude of purposes and applications. For instance, the '977 patent application discloses the use of HVFETs in a circuit for discharging an electromagnetic interference (EMI) filter capacitor (commonly referred to as an X class safety capacitor, or XCAP for short) coupled across the input terminals of a power converter circuit. By way of example, FIG. 2 of the '977 patent application shows two n-channel HVFETs having their drains coupled across an XCAP at the input terminals of a power converter. The sources of the HVFETs are coupled together at an internal ground node. The gates of the HVFETs are coupled to a timing and control circuit, which detects whether an AC electrical energy source is coupled to the input terminals of the power converter. If the electrical energy source is disconnected, the timing and control circuit drives the HVFETs on, thereby providing a current path that rapidly discharges the XCAP. In order to properly switch the gates of the discharge HVFET it is critical that the gate charge of the HVFET be minimized.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DETAILED DESCRIPTION

In the following description specific details are set forth, such as material types, layout shapes, structural features, etc., in order to provide a thorough understanding of the present invention. However, persons having ordinary skill in the relevant arts will appreciate that these specific details may not be needed to practice the present invention. It should also be understood that the elements in the figures are representational, and are not drawn to scale in the interest of clarity.

In the context of the present application a high-voltage or power transistor is any semiconductor transistor structure that is capable of supporting approximately 150V or more in an "off" state or condition. In one embodiment, a high-voltage transistor comprises an N-channel metal-oxide-semiconductor field-effect transistor (MOSFET) with the high-voltage being supported between the source and drain regions.

Figure 1:
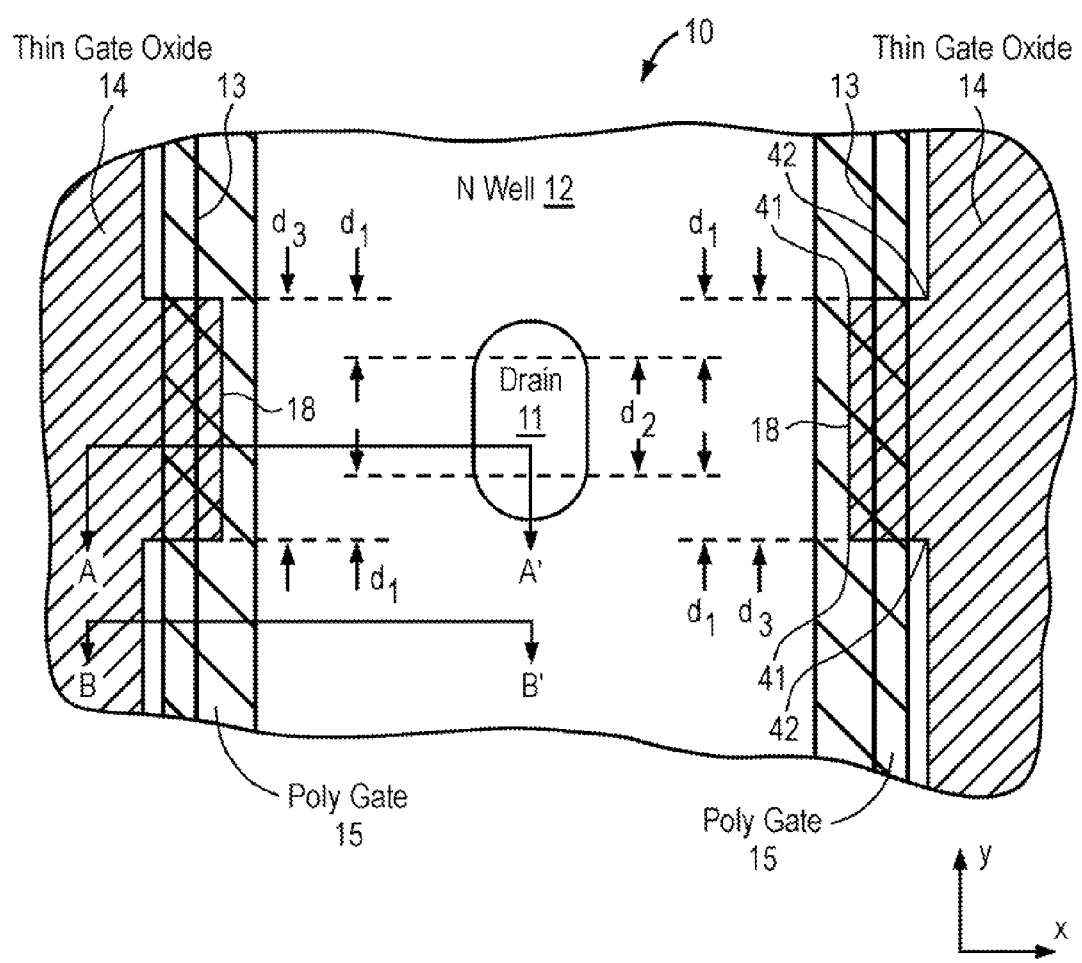
FIG. 1 is an example circuit layout illustrating a portion of a HVFET structure.

FIG. 1 illustrates an example circuit layout illustrating a portion of a HVFET 10 having a structure that includes a drain region 11 of N-type silicon formed in an N-type well region 12. N well region 12 is itself disposed in a P-type silicon substrate, as shown in the cross-sectional views of FIGS. 2 & 3. Practitioners in the art will appreciate that N well region 12 forms an extended drain or drift region of HVFET 10. Drain region 11 is shown being disposed substantially in the center of well region 12, which is shown having boundaries or edges 13 that are laterally separated from drain region 11 in the x-direction. Drain region 11 has a lateral dimension, $d_2$, which extends in the y-direction. Dimension $d_2$ represents the lateral length or height of the linear portion (excluding the rounded end portions) of drain region 11.

The example layout of FIG. 1 also shows a gate 15, which may typically comprise a layer of polysilicon, extending in the y-direction on opposite sides of drain region 11. Each polysilicon member which forms gate 15 extends in the x-direction over a corresponding edge 13 of N well 12. Polysilicon gate 15 is also shown covering an active portion 18 of a thin gate oxide layer 14. As will be discussed in more detail below, active portion 18 of thin gate oxide layer 14 covers the conduction channel area of the transistor that extends between the N+ source (shown in FIG. 2 as region 26) and N well region 12 of the device structure.

In the embodiment shown, active portion 18 of thin gate oxide layer 14 is rectilinear in shape, having a dimension, $d_3$, in the y-direction. Active portion 18 extends partially under gate 15 in the x-direction, covering the channel region in the underlying semiconductor material. Note that in the example of FIG. 1 dimension $d_3$ is larger than dimension $d_2$, with drain region 11 being substantially centered between the outer corners 41 of each active portion 18. To put it differently, active portion 18 of thin gate oxide layer 14 overlaps or extends beyond each edge or boundary of the linear portion of drain region 11 in the y-direction by a distance $d_1$.

In one embodiment dimensions $d_1$, $d_2$, and $d_3$ are 10 µm, 100 µm, and 120 µm, respectively. In alternative embodiments, distance $d_1$ may be zero. In other words, dimension $d_2$ of drain region 11 may be equal to dimension $d_3$ of active portion 18, with corners 41 laterally aligned with the edges or boundaries of the linear portion of drain region 11 in the y-direction. In still other embodiments, dimension $d_3$ of active portion 18 may be slightly smaller than dimension $d_2$ of the linear portion of drain region 11 (i.e., the edges of the linear portion, of drain region 11 overlap or extend beyond corners 41 in the y-direction).

Figure 2:
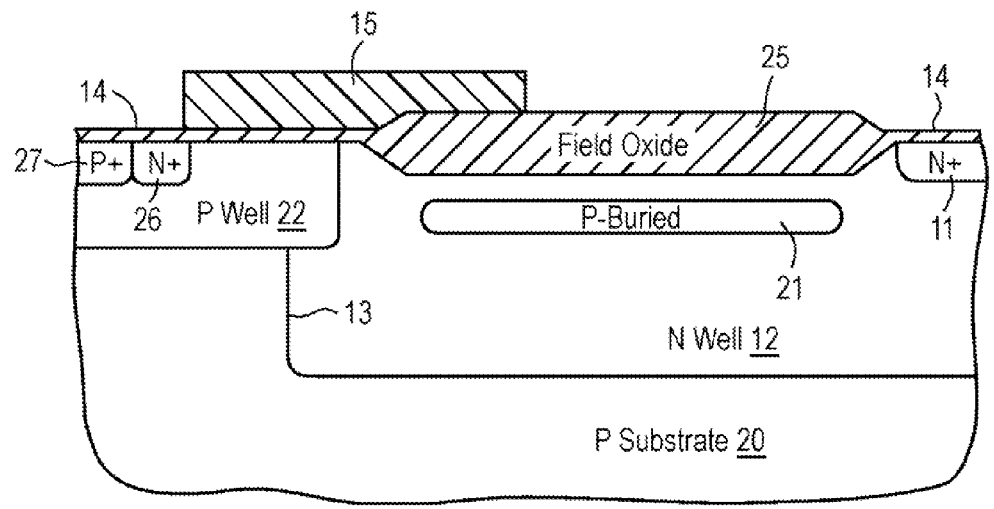
FIG. 2 illustrates an example cross-sectional side view of a section of the HVFET structure shown in FIG. 1, as taken through cut lines A-A'.

FIG. 2 illustrates an example cross-sectional side view of a section of HVFET 10, as taken through cut lines A-A', i.e., through the active area of the device where current flows when HVFET 10 is on. As can be clearly seen, drain region 11 is disposed in N well 12 at the right-hand edge of a relatively thick field oxide layer 25. Polysilicon gate member 15 overlaps the left-hand edge of field oxide layer 25, extending laterally over active section 18 (see FIG. 1) of thin gate oxide layer 14 to just beyond the edge of N+ source region 26. Source region 26 is disposed in P-type well 22 adjacent to a P+ contact region 27.

It is appreciated that instead of arranging P+ contact region 27 laterally adjacent to N+ source region 26 in the x-direction, other embodiments may be structured with regions 26 & 27 disposed laterally adjacent to one another in the y-direction.

In the embodiment shown, P-well 22 extends across boundary 13 into N well 12, but stops just short of field oxide layer 25. A P-type buried layer 21 is also shown being embedded within N well region 12 under field oxide layer 25, extending laterally across the drift region from near N+ drain region to near P-well 22. P-type buried layer 21 is vertically separated from field oxide layer 25 and P-substrate 20 so as to create a pair of JFET conduction channels in N well 12. In alternative embodiments the number of JFET channels may be increased by inclusion of additional P-type buried layers stacked vertically and spaced-apart from one another within N well region 12.

Practitioners in the semiconductor device arts will understand that P-type buried region 21, source region 26 and P-substrate 20 are typically commonly coupled to ground potential. The inclusion of P-type buried region 21 in N well region 12 increases the charge in the JFET channel of the HVFET, thereby lowering the on-resistance, $R_{sp}$, of the device. In the off-state, P-type buried region 21 helps to deplete the extended drain (N well 12) of charge when the extended drain is supporting a high voltage. A high breakdown voltage can thus be maintained despite the increased charge density.

When the HVFET is on, current flows laterally in the x-direction through the channel region between the source and drain regions. That is, current flows from the source (not shown for clarity reasons), laterally in the channel region under both gate 15 and the active portion 18 of thin gate oxide layer 14 to drain region 11. Substantially no current flows in the inactive portions of the device structure, which are located in the areas laterally above and below active portion 18 and drain region 11.

Persons of skill in the semiconductor arts will understand that the entire region where polysilicon gate 15 overlaps active section 18 of thin gate oxide layer 14 (shown cross-hatched in FIG. 1) contributes to gate charge of the HVFET device structure. The gate charge contribution from the inactive area is substantially eliminated by removal or pull-back of the thin gate oxide overlap region in the inactive areas of the device. This should be implemented without disturbing the electric field distribution; that is, there should be a smooth transition from active section 18 to the inactive areas or sections of HVFET 10.

Figure 3:
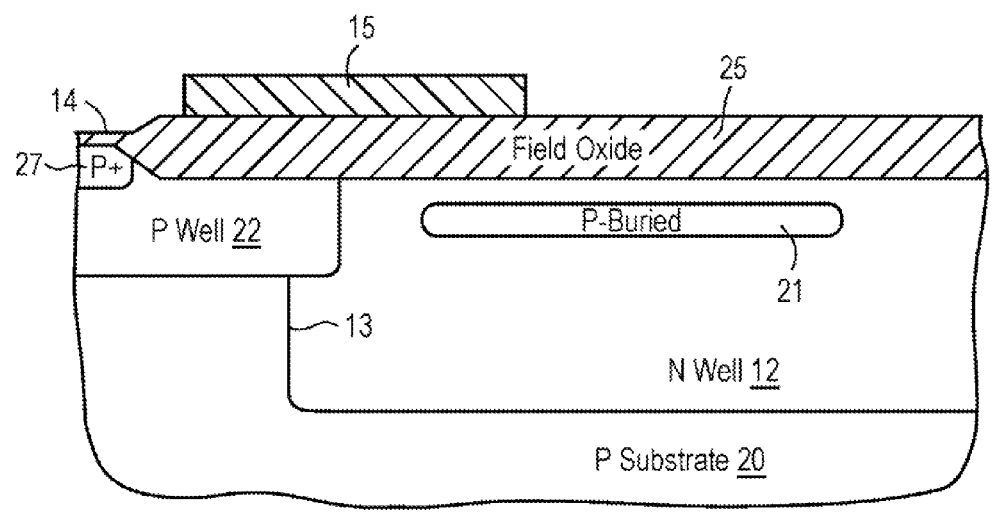
FIG. 3 illustrates an example cross-sectional side view of a section of the HVFET structure shown in FIG. 1, as taken through cut lines B-B'.

FIG. 3 illustrates an example cross-sectional side view of a section of the HVFET structure shown in FIG. 1, as taken through cut lines B-B', which represents the inactive area of the transistor device. Note that any gate charge contribution from the inactive portion is eliminated by the absence of thin gate oxide layer 14 beneath gate member 15. That is, in the cross-sectional side view of FIG. 3, gate member 15 is disposed entirely over field oxide layer 25, which extends laterally over the entire N well region 12 and P-well region 22 up to P+ contact region 27. Note also that in the example cross-sectional side view of FIG. 3, P+ contact region 27 and P-buried layer 21 are present, but N+ drain region 11 and N+ source region 26 are not present (i.e., eliminated) in the inactive area of HVFET 10.

It is appreciated that in FIGS. 2 & 3, one or more additional interlayer dielectric materials (e.g., oxide, nitride, etc.) may cover gate member 15, field oxide layer 25 and other areas of the substrate. In addition, openings in the dielectric layers are typically formed to allow various metallization layers/electrodes to electrically connect with source region 26, drain region 11, P+ contact region 27, and gate 15. These additional elements/regions have not been shown in the cross-sectional views of FIGS. 2 & 3 for purposes of clarity.

Figure 4:
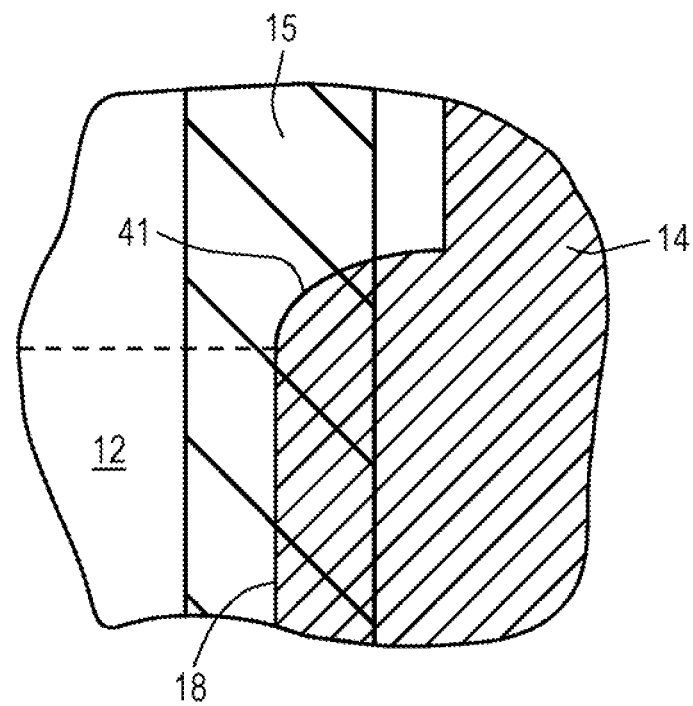
FIG. 4 illustrates one of the corner areas of an active section of another example layout of a HVFET structure shown in FIG. 1.
Figure 5:
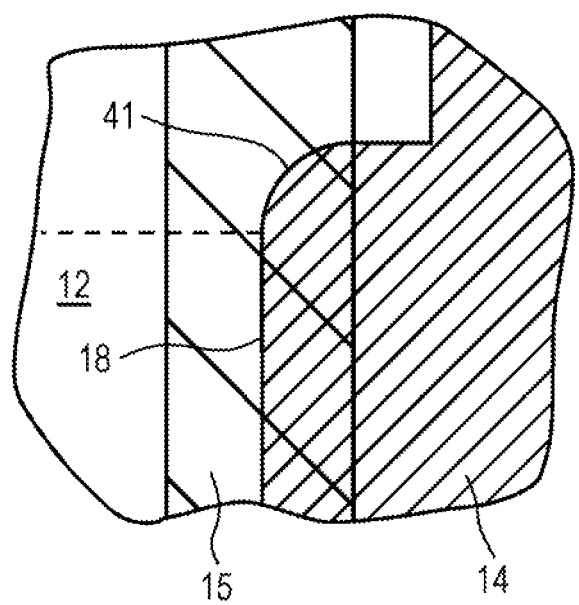
FIG. 5 illustrates one of the corner areas of an active section of yet another example layout of a HVFET structure shown in FIG. 1.

FIGS. 4 & 5 illustrate different embodiments of one of the corner areas of active section 18. For example, FIG. 4 shows the layout of outside corner 41 transitioning smoothly between the x & y lateral directions from the active to the inactive area of thin gate oxide layer 14 in an elliptically-curved layout shape. In contrast, the embodiment of FIG. 1 shows outside corner 41 transitioning from the active area to the inactive area of thin gate oxide layer 14 in an abrupt, nearly orthogonal manner. The horizontal dashed-line in FIG. 4 represents the location of the right-angle outside corner 41 shown in FIG. 1. In other words, in the embodiment of FIG. 4 the curved transition of outside corner 41 extends laterally in the y-direction beyond the edge or point where the dimension $d_3$ is measured in FIG. 1.

FIG. 5 illustrates the layout of outside corner 41 having a rounded, semi-circular arc layout shape. In the embodiment shown, curve of outside corner 41 is a full quarter-circle. As in the case of FIG. 4, the horizontal dashed-line in FIG. 5 shows the location of the right-angle outside corner 41 of FIG. 1. Again, the curved transition of outside corner 41 extends beyond the dimension $d_3$ of FIG. 1. Practitioners will appreciate that the curved shapes of outside corner 41 in the examples of FIGS. 4 & 5 prevent potentially hazardous electric field build-up from occurring in outside corners 41, as may occur in the case of a more abrupt layout transition of the thin gate oxide layer 14 in active section 18 of the device. Stated differently, sharp outside corners 41 may enhance the electric field resulting in premature breakdown. The smooth transition at outside corners 41 in active section 18 maintains the electric field distribution needed to support high-voltages.

Although the above embodiments have been described in conjunction with a specific device types, those of ordinary skill in the arts will appreciate that numerous modifications and alterations are well within the scope of the present invention. For instance, although HVFETs have been described, the methods, layouts and structures shown are equally applicable to other structures and device types, including Schottky, diode, IGBT and bipolar structures. Accordingly, the specification and drawings are to be regarded in an illustrative rather than a restrictive sense.

We claim:

1. A high voltage field-effect transistor (HVFET) comprising:
    a substrate of a first conductivity type;
    a first well region of a second conductivity type disposed in the substrate, the first well region having a lateral boundary;
    a drain region of the second conductivity type disposed in the first well region, the drain region having a first dimension in a first lateral direction, an extended drain region of the first well region separating the drain region from the lateral boundary in a second lateral direction orthogonal to the first lateral direction;
    a second well region of the first conductivity type disposed in the substrate, the second well region extending past the lateral boundary into the first well region;
    a source region of the second conductivity type disposed in the second well region, a channel region being defined between the source region and the first well region;
    a field oxide layer that substantially covers the first well region, the field oxide layer having a first thickness and extending in the second lateral direction from the drain region to near the second well region in an active area of the HVFET, the field oxide layer extending past the lateral boundary to the source region in an inactive area of the HVFET;
    a gate oxide that covers the channel region in the active area, the gate oxide having a second thickness substantially thinner than the first thickness;
    a gate disposed over the channel region, the gate extending in the second lateral direction from the source region to at least the field oxide layer, the gate being insulated from the channel region by the gate oxide in the active area, the gate being separated from the first and second well regions over the inactive area by at least the first dimension of the field oxide layer.

2. The HVFET of claim 1 wherein the gate oxide has a substantially linear edge that extends in the first lateral direction, the substantially linear edge having a second dimension in the active area.

3. The HVFET of claim 2 wherein the gate extends in the first lateral dimension over an inactive area of the HVFET beyond the second dimension of the gate oxide.

4. The HVFET of claim 2 wherein the second dimension is greater than or equal to the first dimension.

5. The HVFET of claim 2 wherein the second dimension is approximately equal to the first dimension.

6. The HVFET of claim 2 wherein the gate oxide includes first and second outside corner areas respectively located at opposite ends of the substantially linear edge.

7. The HVFET of claim 6 wherein the first and second outside corner areas of the gate oxide each include a transition area between the active area and inactive area, the transition area having a curved shape that extends in the first and second directions.

8. The HVFET of claim 7 wherein the curved shape comprises a semi-circular shape.

9. The HVFET of claim 1 further comprising a buried region of the first conductivity type disposed within the first well region, a first conduction channel being formed above the buried region and a second conduction channel being formed below the buried region, the buried region being spaced-apart from the drain region the first conductivity type is P-type and the second conductivity type is N-type.

10. The HVFET of claim 1 wherein the first dimension comprises a length of a linear portion of the drain region.

* * * * *